United States Patent
Otsuka et al.

(10) Patent No.: US 10,709,050 B2
(45) Date of Patent: Jul. 7, 2020

(54) COMPONENT SUPPLY DEVICE AND COMPONENT MANAGEMENT SYSTEM USING THE SAME

(71) Applicant: Panasonic Intellectual Property Management Co., Ltd., Osaka (JP)

(72) Inventors: Toshihide Otsuka, Tokyo (JP); Yasutomo Terashima, Tokyo (JP); Yuji Nakamura, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 134 days.

(21) Appl. No.: 15/873,165

(22) Filed: Jan. 17, 2018

(65) Prior Publication Data

US 2018/0220560 A1 Aug. 2, 2018

(30) Foreign Application Priority Data

Jan. 31, 2017 (JP) .................................. 2017-015537
Jan. 31, 2017 (JP) .................................. 2017-015539

(51) Int. Cl.
*H05K 13/04* (2006.01)
*H05K 13/08* (2006.01)

(52) U.S. Cl.
CPC ..... *H05K 13/0452* (2013.01); *H05K 13/0417* (2013.01); *H05K 13/0419* (2018.08); *H05K 13/086* (2018.08)

(58) Field of Classification Search
None
See application file for complete search history.

(56) References Cited

U.S. PATENT DOCUMENTS

| | | | | |
|---|---|---|---|---|
| 5,694,443 A | * | 12/1997 | Stone | H05K 13/0417 377/6 |
| 5,930,140 A | * | 7/1999 | Asai | H05K 13/02 700/121 |
| 6,368,045 B1 | * | 4/2002 | Ashman | B65H 20/22 414/403 |
| 6,675,056 B1 | * | 1/2004 | Black, Jr. | H05K 13/084 700/116 |
| 2010/0313407 A1 | * | 12/2010 | Ohno | H05K 13/0417 29/464 |
| 2012/0048919 A1 | | 3/2012 | Okada et al. | |
| 2016/0086790 A1 | * | 3/2016 | Maenishi | G05B 19/41805 700/121 |
| 2017/0188492 A1 | * | 6/2017 | Eguchi | H05K 13/08 |
| 2018/0116079 A1 | * | 4/2018 | Horaguchi | H05K 13/02 |
| 2018/0130011 A1 | * | 5/2018 | Jacobsson | G06Q 10/087 |

FOREIGN PATENT DOCUMENTS

| | | |
|---|---|---|
| JP | 2009-302184 A | 12/2009 |
| JP | 4814046 B | 11/2011 |
| JP | 5293705 B | 9/2013 |

* cited by examiner

*Primary Examiner* — Thomas C Lee
*Assistant Examiner* — Gary Collins
(74) *Attorney, Agent, or Firm* — Pearne & Gordon LLP (57) ABSTRACT

A component management system includes an acquirer that acquires the component information from the component supply device, a management system side storage that stores the component information acquired by the acquirer in association with the component supply device, and an information updater that updates the component information stored in the component supply device side storage and the management system side storage based on a detection result of the detector.

9 Claims, 9 Drawing Sheets

| | COMPONENT INFORMATION | | | | | |
|---|---|---|---|---|---|---|
| NO. | COMPONENT NAME | COMPONENT ID | COMPONENT REMAINING NUMBER | FEEDER ID | LOCATION INFORMATION | STATUS |
| 1 | Pa a | p1*a | *** | f1*1 | L(1),M4,S(3) | IN USE |
| 2 | Pb b | p1*b | *** | f1*2 | L(1),M5,S(4) | IN USE |
| 3 | Pc c | p1*c | *** | f1*3 | COMPONENT SHELF (1) | UNUSED |
| 4 | Pd d | p1*d | *** | f1*4 | FL(1) | UNUSED |
| 5 | Pe e | p1*e | *** | (0000) | FL(2) | UNUSED |

COMPONENT SUPPLY DEVICE AND COMPONENT MANAGEMENT SYSTEM USING THE SAME

BACKGROUND

1. Technical Field

The present disclosure relates to a component supply device that transports a component storage storing a component to a predetermined position and supplies the component storage to a component mounter, and a component management system that manages the component supplied to the component mounter.

2. Description of the Related Art

In a component mounter for mounting a component on a board, a component supply device such as a tape feeder is used as a means for supplying the component to a component suction position by a mounting head of a component mounting mechanism. For example, in a case of using the tape feeder, a carrier tape holding the component is supplied in a state of being wound and stored on a supply reel, and a plurality of tape feeders in a state where the supply reel is set are installed in an installing slot of a component supplier disposed in the component mounter. In a component mounting operation, a component supply to the component suction position is performed by pitch feed of the carrier tape by the tape feeder.

A type of board to be mounted by the component mounter is appropriately switched according to a production plan. Therefore, in a production floor on which the component mounters are disposed in large numbers, it is required to manage the component to prepare the component to be supplied according to the type of board to be mounted. In a case of supplying the component by the tape feeder, the supply reel is handled in a state where the supply reel is set fixedly to the tape feeder in many cases. Therefore, the supply reel and the tape feeder are performed as one unit in many cases, such as installing work to the component supplier for production preparation and storage of the component after production use. The number of components that are generally subject to component management is enormous on the production floor. Therefore, a component management system is proposed to facilitate identification and a search of a physical object in a component management by installing an RF tag to which an ID is individually assigned to an object to be managed and enabling the search by wireless communication (for example, Japanese Patent No. 5293705 (PTL 1)).

In the example shown in PTL 1, a component held by a supply reel is supplied to a mounting device by a cassette jig (tape feeder).

By handling a combination of the cassette jig and the supply reel in a storage area without losing the combination, and causing a light emitting element provided in the RF tag installed to the cassette jig to emit light, the tape feeder and the supply reel to be searched are identified. That is, an identifier for identifying the component and an identifier for identifying the cassette jig are previously stored in correspondence with each other. When searching for the specific component, the cassette jig on which the component to be searched is mounted is identified based on a stored correspondence relationship, and the RF tag installed on the cassette jig is identified and the light emitting element is caused to emit light. As a result, it possible to efficiently search a location of a target component in a set-up changing work for attaching and detaching an electronic component to and from a placing device.

The number of components that are generally subject to component management is enormous on the production floor. Therefore, there is known a component supply device that increases efficiency of information transmission by installing an IC tag to which an ID is individually assigned to an object to be managed, and transmitting information required for a component management such as a component information by wireless communication (for example, Japanese Patent No. 4814046 (PTL 2)).

In the prior art shown in PTL 2, in order to enable transmission and reception of component information of a component stored in a tape feeder with other component part in a component mounter when the tape feeder is in an independent state, the tape feeder has external communication means and a battery. Furthermore, a configuration is disclosed in which communication means for transmitting information of the tape feeder to a main body of the component mounter is provided on a carriage to which the tape feeder is installed.

SUMMARY

A component management system of the disclosure is a component management system that manages a component in a component supply device.

The component supply device transports a component storage storing the component to a predetermined position and supplies the component storage to a component mounter.

The component supply device includes a component supply device side storage that stores component information of the component stored in the component storage, a communicator that communicates with the component management system, a battery that supplies power in a case where power is not supplied from the component mounter to the component supply device, and a detector that detects presence or absence of the component storage.

The component management system includes an acquirer that acquires the component information from the component supply device, a management system side storage that stores the component information acquired by the acquirer in association with the component supply device, and an information updater that updates the component information stored in the component supply device side storage and the management system side storage based on a detection result of the detector.

The component supply device of the disclosure includes an adapter including an input/output part that transmits at least one of power supply and information input/output, a communicator that communicates with a management system managing the component mounter, a storage that stores component information of the component stored in the component storage, and a battery that supplies power to the component supply device when the component supply device is not set to the component mounter, in which the adapter can be attached to the input/output part.

The component supply device of the disclosure includes an adapter including a storage that stores component information of the component stored in the component storage, an input/output part that transmits at least one of power supply and information input/output, a communicator that communicates with a management system managing the component mounter, and a battery that supplies power to the component supply device when the component supply device is not set to the component mounter, in which the adapter can be attached to the input/output part.

DETAILED DESCRIPTION

In the prior art shown in Patent Document 1, it is assumed that handling is performed without losing a combination of a cassette jig and a supply reel. However, in a production area of component mounting, it is not always that a tape feeder serving as a cassette jig and the supply reel are fixedly associated with each other, so that the supply reel may be detached from a tape feeder main body.

The tape feeder from which the supply reel is removed is used in combination with other supply reel. However, in a case where the supply reel to be combined at this time is a supply reel storing other type of component, a correspondence relationship between the tape feeder and the supply reel is different from the correspondence relationship shown in a component data initially set. As a result, a type of component on the component data stored in the tape feeder is different from a type of component actually set in the tape feeder, which causes an incorrect mounting that mounts a different component in a component mounting work.

That is, in the related art, since it is assumed that the correspondence relationship between the tape feeder and the supply reel is completely fixed, it is difficult to deal with a case where the supply reel is removed from the tape feeder and these are stored in a separate state. Therefore, a range of a component form in which a component management is normally performed is limited, and in a case where the tape feeders out of such range such as a tape feeder in the separate state are mixed, it is a factor causing a problem such as incorrect mounting in component mounting work.

Next, embodiments of the disclosure will be described with reference to the drawings. First, the configuration of component mounting system 1 will be described with reference to FIG. 1. Component mounting system 1 has a function of mounting a component supplied by a component supply device such as a tape feeder on a board to produce a mounting board. In the example shown in an exemplary embodiment, component mounting system 1 includes a plurality of component mounting lines 4 configured by connecting board supply device M1, board transfer device M2, solder printer M3, component mounters M4 and M5, reflow device M6, and board recovery device M7 in series. The line numbers L (1), L (2), . . . are assigned to each of component mounting lines 4, and component mounting line 4 can individually be identified by these line numbers.

Figure 1:
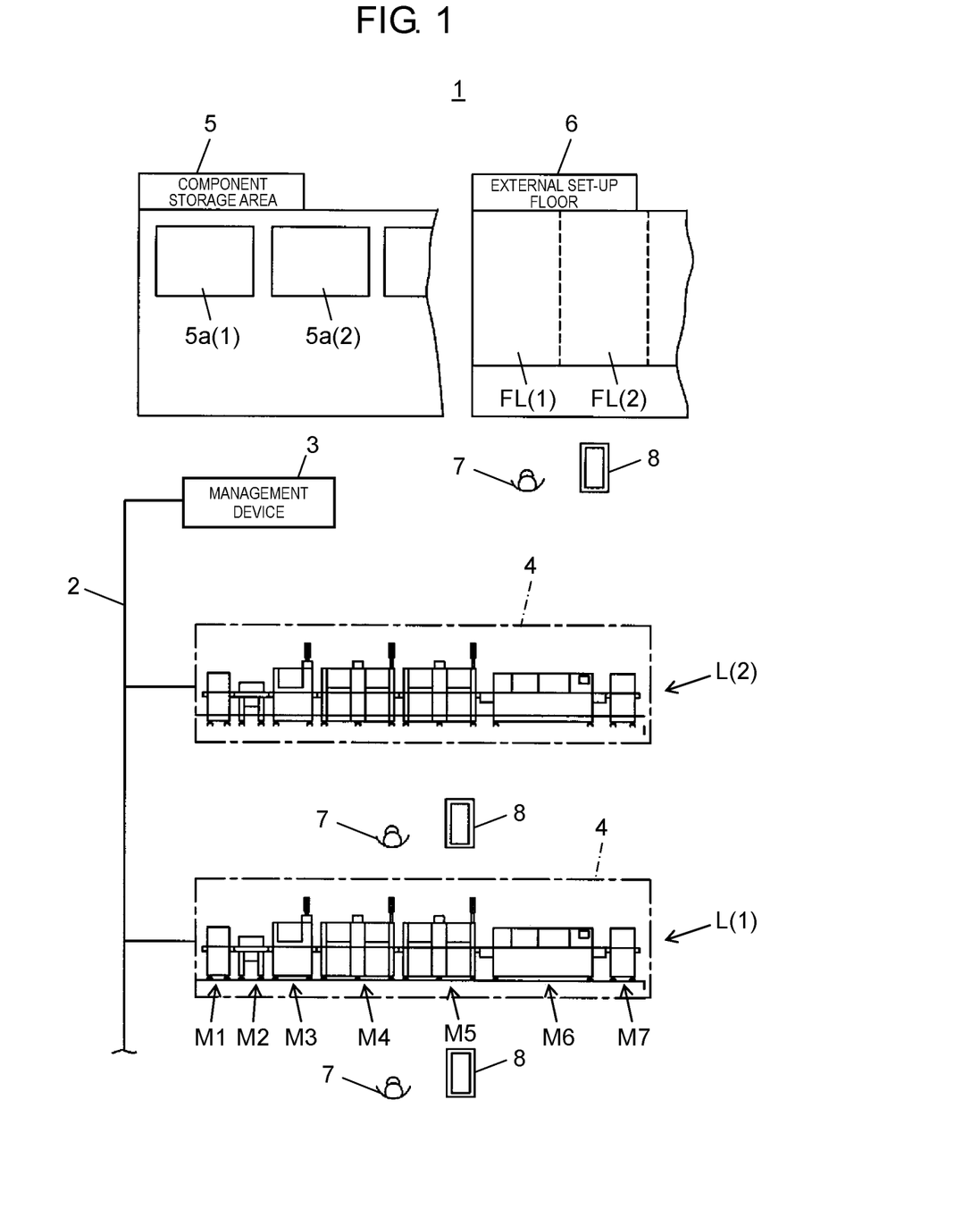
FIG. 1 is a configuration explanatory diagram of a component mounting system to which a component management system of an exemplary embodiment is applied.

Each device of board supplier M1 to board recovery device M7 constituting component mounting line 4 is connected to management device 3 via communication network 2. In addition to a function as a management system for managing a component mounting work performed by component mounting line 4, management device 3 has a function as a component management system for managing a component supplied to component mounting line 4 in the exemplary embodiment.

In the component mounting work by component mounting line 4, a board supplied by board supplier M1 is carried to solder printer M3 via board transfer device M2, where a solder printing work for screen-printing a solder for component bonding is performed on the board. The board after the screen printing is sequentially handed over to component mounters M4 and M5, where a component mounting work for mounting the component on the board after solder printing is performed. After mounting the component, the board is carried into reflow device M6, where the board is heated according to a predetermined heating profile, so that the solder for component bonding is melted and solidified. As a result, the electronic component is soldered to the board and the mounting board on which the electronic component is mounted on the board is completed and collected in board recovery device M7.

Figure 2A:
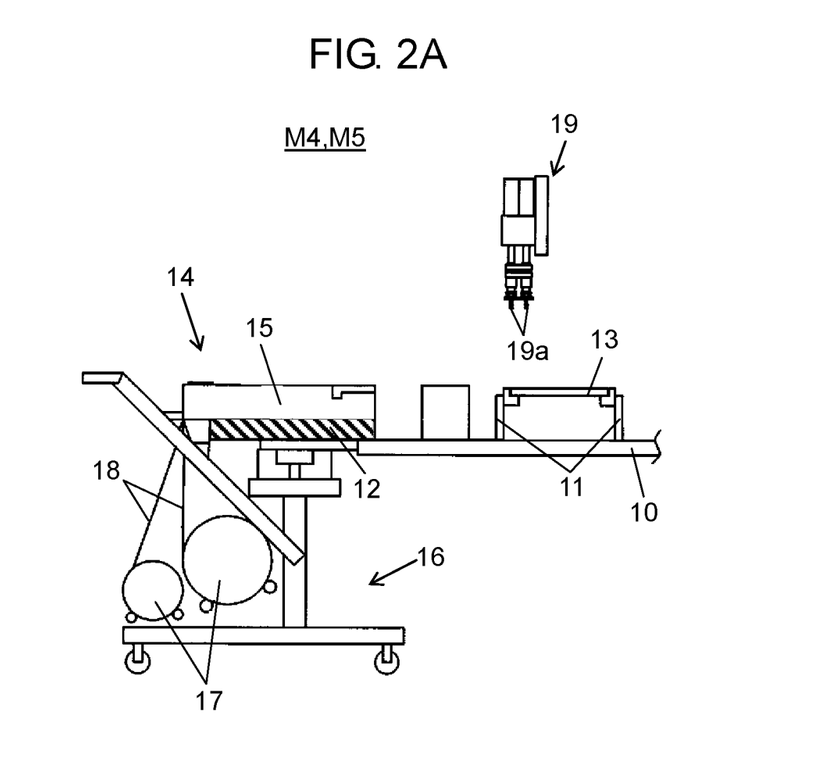
FIG. 2A is a configuration explanatory diagram of a component mounter and a component supply device to which the component management system of the exemplary embodiment is applied.
Figure 2B:
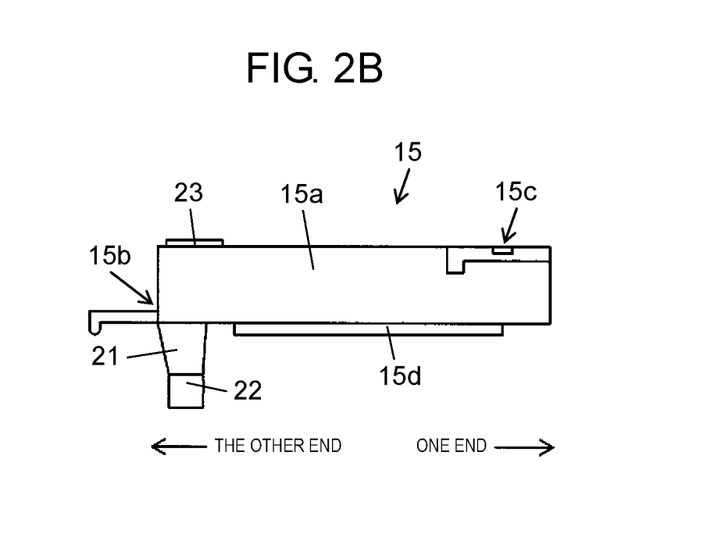
FIG. 2B is a configuration explanatory diagram of the component supply device to which the component management system of the exemplary embodiment is applied.

In component mounting system 1, component storage area 5 and external set-up floor 6 are disposed. Component storage area 5 is provided with a plurality of component shelves 5a, and in each of component shelves 5a, materials used for the component mounting work in component mounting line 4 such as tape feeder 15 (component supply device) and supply reel 17 shown in FIG. 2 are stored. The shelf numbers (1), (2), . . . are assigned to each of component shelf 5a, and component shelf 5a can individually be identified by these shelf numbers.

External set-up floor 6 is a predetermined external set-up work floor targeting the material delivered from component storage area 5, that is, a work floor for performing a component preparation work at the stage before being carried into component mounting line 4. For example, supply reel 17 which is individually delivered from component storage area 5 is attached to corresponding tape feeder 15 before being carried into component mounting line 4 on external set-up floor 6. A plurality of work floors FL are provided on external set-up floor 6, floor numbers FL (1), FL (2), . . . are assigned to each of the work floors FL, and the work floor FL can be individually identified by these floor numbers.

In component mounting system 1, a plurality of operators 7 carrying portable terminal 8 and performing the work are allocated. Operator 7 performs various works required for the component mounting work in component mounting system 1, with component storage area 5, external set-up floor 6, and component mounting line 4 as the work target area. Upon performing the work, operator 7 refers to a work instruction displayed on portable terminal 8 by a management function of management device 3. In the exemplary embodiment, management device 3 as the component management system manages the component attached to the tape feeder which is the component supply device supplying the component to the component mounters M4 and M5 of component mounting line 4 by the configuration shown below.

With reference to FIGS. 2A and 2B, an outline of the configuration and function of tape feeder 15 as the component supply device used in component mounters M4 and M5 of component mounting line 4 will be described. FIG. 2A shows a partial cross section of component mounters M4 and M5, and FIG. 2B shows a side view of tape feeder 15 in a state removed from component mounters M4 and M5.

As shown in FIG. 2A, board transport mechanism 11 for transporting board 13 to be mounted is disposed on the base 10, and component supplier 14 for supplying the component is disposed on the side of board transport mechanism 11. Carriage 16 on which tape feeder 15 is installed, and holding supply reel 17 below tape feeder 15 is set to component supplier 14. Feeder base 12 for installing tape feeder 15 is provided on carriage 16.

A plurality of installing slots (not shown) for installing tape feeder 15 are provided on the upper surface of feeder base 12. As shown in FIG. 2B, installing guide 15d extending in the longitudinal direction of tape feeder 15 is provided in a projected shape on the lower surface of body 15a of tape feeder 15. Installing guide 15d is fitted into the installing slot, so that tape feeder 15 is fixedly installed on feeder base 12. Slot numbers are assigned to the respective installing slots, and tape feeders 15 attached to component mounters M4 and M5 can be individually identified according to these slot numbers. Carrier tape 18 serving as a component storage storing the component to be mounted is stored in a rolled state in supply reel 17. Carrier tape 18 withdrawn from supply reel 17 is inserted into tape feeder 15 from tape insertion port 15b shown in FIG. 2B, and is transported to component suction position 15c by suction nozzle 19a of mounting head 19, which is a predetermined position by a tape feed mechanism incorporated in body 15a. As a result, the component stored and held in carrier tape 18 is supplied to a component mounting mechanism of component mounters M4 and M5, and is transferred and mounted on board 13.

On the end (the other end) opposite to the end (one end) on the side where component suction position 15c is provided and to be installed on component mounters M4 and M5 in tape feeder 15, input/output part 21 is provided extending downward from body 15a. That is, input/output part 21 is disposed on the side opposite to the side where tape feeder 15 is installed on component mounters M4 and M5. In a state where tape feeder 15 is installed on feeder base 12, input/output part 21 is connected to a connector (not shown) provided in feeder base 12. As a result, tape feeder 15 is electrically connected to the device body of component mounters M4 and M5, so that information between tape feeder 15 and the device body is transmitted and power is supplied to tape feeder 15. That is, input/output part 21 has a function of transmitting at least one of power supply and information input/output.

Display board 23 having a light emitting element such as a light emitting diode (LED) is provided on the upper surface of the other end side of body 15a. Display board 23 notifies a predetermined item by a command from feeder controller 41 (refer to FIG. 4) of tape feeder 15. In the exemplary embodiment, display board 23 is turned on in accordance with an instruction from management device 3, thereby notifies a location of tape feeder 15.

Adapter 22 is attached to the lower end of input/output part 21. Adapter 22 incorporates rechargeable battery 25 and communicator 24 capable of communicating with other devices connected to communication network 2 by wireless communication (refer to FIG. 4). Adapter 22 can additionally be connected to input/output part 21 in a so-called post-installation. By adding adapter 22, even when tape feeder 15 is not set to the component mounter, power can be supplied to tape feeder 15 by battery 25. Furthermore, even in a stand-alone state where tape feeder 15 is removed from the component mounter, information can be transmitted to and from management device 3 by communicator 24.

As a result, in tape feeder 15 of a single state of being removed from the component mounter, a tape feed adjustment for adjusting a tape stop position of carrier tape 18 at component suction position 15c and a winding adjustment of a top tape peeled off from carrier tape 18 can be performed in the stand-alone state. Even in the stand-alone state, information can be transmitted to and from management device 3, so that the component management such as management of the component remaining number in tape feeder 15 and grasp of the location of tape feeder 15 can be performed in the stand-alone state. In the exemplary embodiment, a configuration example in which adapter 22 having the above-described function is additionally attached to input/output part 21 is shown, but the function of communicator 24 and battery 25 of adapter 22 may be incorporated in tape feeder 15.

Figure 3A:
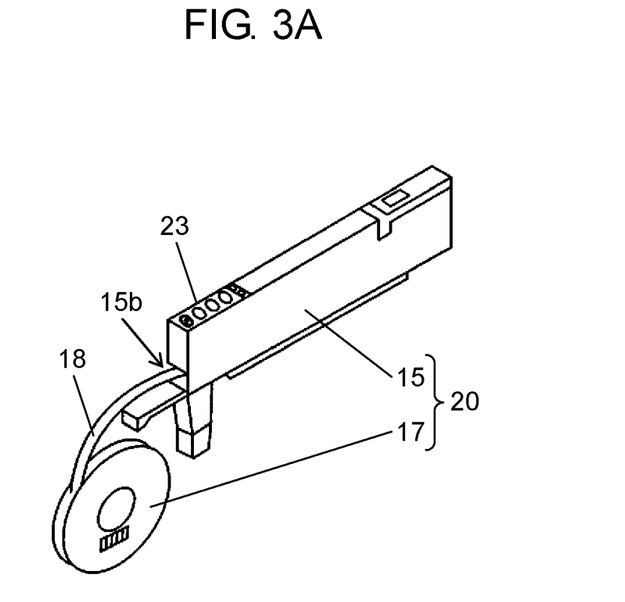
FIG. 3A is an explanatory diagram of a storage form of the component supply device to which the component management system of the exemplary embodiment is to be applied.
Figure 3B:
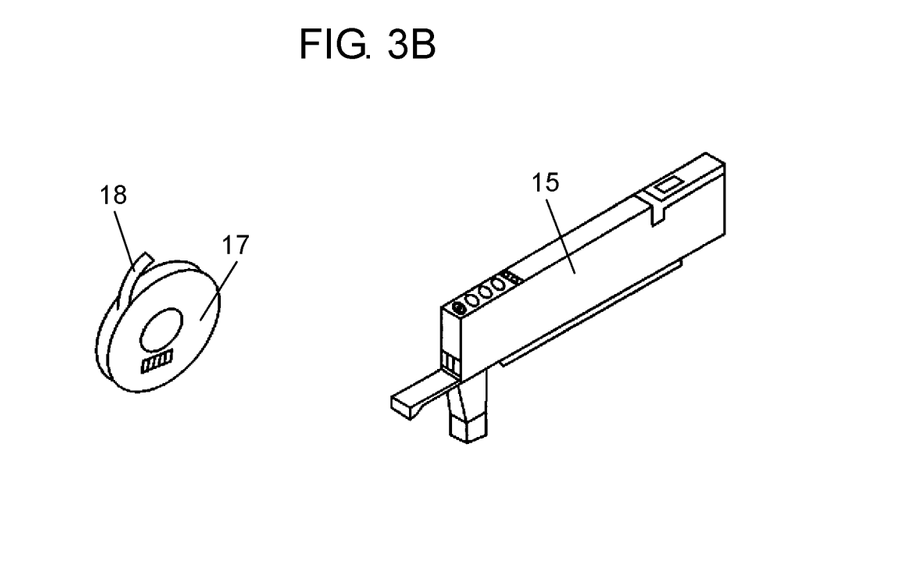
FIG. 3B is an explanatory diagram of the storage form of the component supply device to which the component management system of the exemplary embodiment is to be applied.

FIGS. 3A and 3B show handling packages of tape feeder 15 and supply reel 17 in the component management according to the exemplary embodiment. FIG. 3A shows an example in which tape feeder 15 and supply reel 17 are handled in the form of component unit 20 as one unit. That is, in this case, carrier tape 18 withdrawn from supply reel 17 is handled in a state being inserted into tape feeder 15 from tape insertion port 15b. In this state, for example, component unit 20 is stored in component shelf 5a of component storage area 5.

On the other hand, FIG. 3B shows an example in which tape feeder 15 and supply reel 17 are individually handled. In this case, tape feeder 15 and supply reel 17 are individually carried into external set-up floor 6, and in the external setup work performed here, carrier tape 18 withdrawn from supply reel 17 is inserted into tape feeder 15 to be integrated. In addition to a case where tape feeder 15 and supply reel 17 in a state individually stored from the beginning are to be worked, such handling occurs in a case where supply reel 17 is detached from tape feeder 15 due to some reason, such as an operation mistake, from a state of component unit 20 shown in FIG. 3A.

Figure 4:
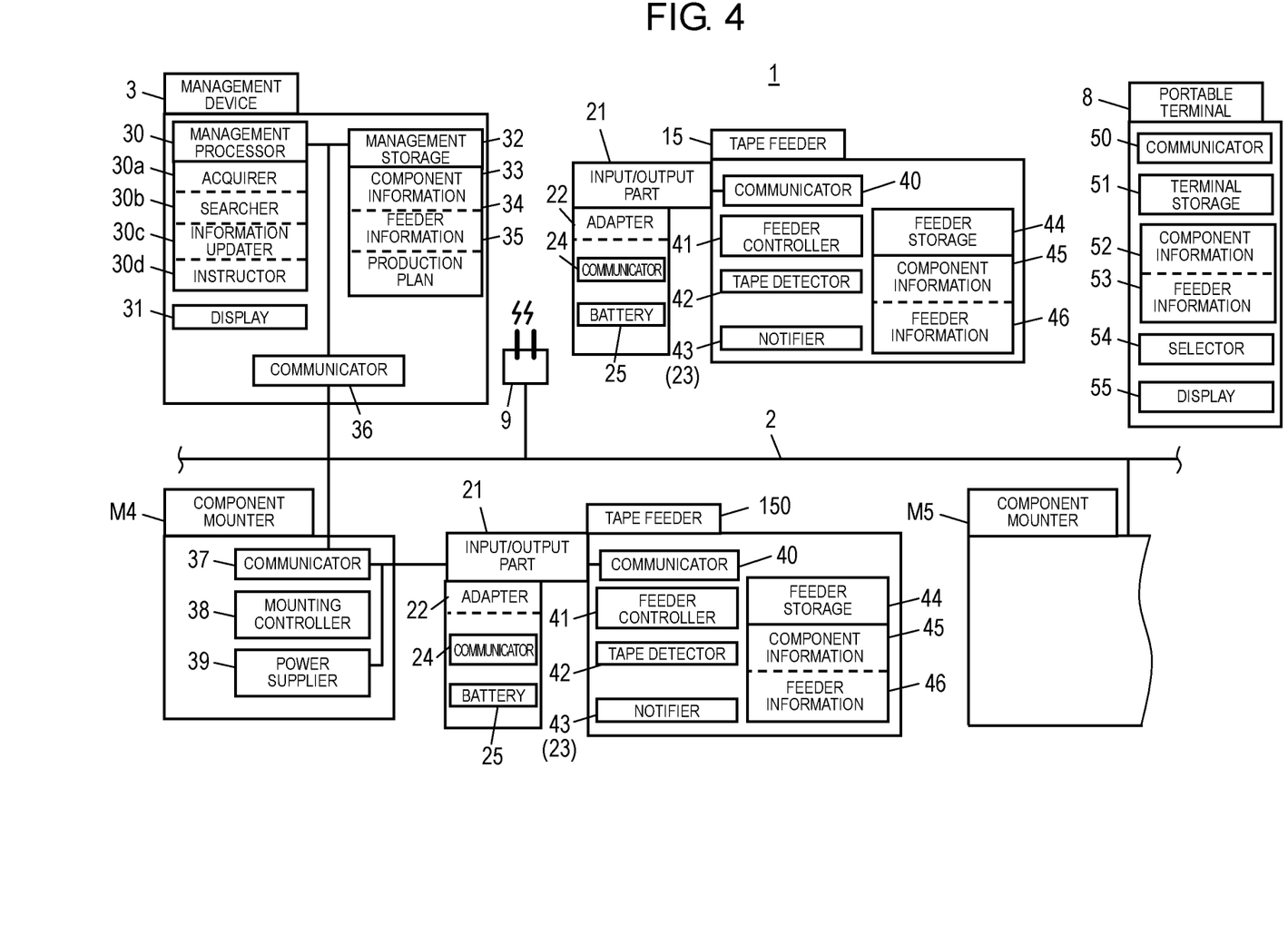
FIG. 4 is a block diagram showing a configuration of a control system of the component mounting system to which the component management system of the exemplary embodiment is applied.

Next, a configuration of a control system of component mounting system 1 will be described with reference to FIG. 4. Here, among the various functions of component mounting system 1, only the element related to the component management function targeting the component supplied to component mounters M4 and M5 is described. In FIG. 4, tape feeder 15 shows a tape feeder in a single state which is not attached to component mounters M4 and M5 constituting component mounting line 4. Tape feeder 150 shows a tape feeder in the installed state attached to component mounters M4 and M5.

In FIG. 4, tape feeder 15 has communicator 40, feeder controller 41, tape detector 42, notifier 43, and feeder storage 44. Communicator 40 is a communication interface and is connected to input/output part 21 (refer to FIGS. 2A and 2B). Communicator 24 having a wireless communication function and adapter 22 incorporating battery 25 are connected to input/output part 21. As a result, even in a case where tape feeder 15 is detached from the component mounter as described above and power is not supplied from the component mounter to tape feeder 15, power is supplied to tape feeder 15 in a single state, so that various adjustment operations are possible. It is possible to communicate with management device 3 via wireless station 9 provided in communication network 2.

Feeder controller 41 performs control processing such as control of a tape feed operation in tape feeder 15, communication control between the component mounter and management device 3, and further updating of component information 45 stored in feeder storage 44 described below. Tape detector 42 detects a presence or absence of carrier tape 18 as the component storage in tape feeder 15 as the component supply device. As a method of detecting the presence or absence of carrier tape 18, there are several variations depending on a structure of tape feeder 15 used in combination with carrier tape 18.

For example, there is a case where tape feeder 15 configured to peel off the cover tape attached to the upper surface of carrier tape 18 covering the component in front of component suction position 15c, and to collect the cover tape inside body 15a is used as tape feeder 15. In this case, a method of detecting the presence or absence of carrier tape 18 is used depending on whether tension of the peeled cover tape is detected or not. As tape feeder 15, tape feeder 15 of a so-called auto-loading system which continuously feeds two preceding and following carrier tapes 18 without using the above-described peeling of the cover tape may be used in some cases. In this case, a method of directly detecting the presence or absence of carrier tape 18 is used by a tape detection sensor provided in a tape feed path.

Notifier 43 notifies the location of the component supply device by turning on display board 23 provided in tape feeder 15. Feeder storage 44 is a component supply device side storage and stores component information 45 and feeder information 46 on the component stored in carrier tape 18 transported by tape feeder 15. Feeder information 46 is identification information of tape feeder 15 indicating the type of tape feeder 15, a feeder ID, and the like.

Component information 45 is a component ID that identifies the type of component. In the example shown in the exemplary embodiment, feeder storage 44 (component supply device side storage) is provided with two memories (first memory and second memory) each of which individually stores the component ID. In a case where only one carrier tape 18 is inserted in tape feeder 15, the component ID is written in only one of the first memory and the second memory. In a following case, the component ID is written in both the first memory and the second memory.

There is a case where tape feeder 15 to be used is manual loading tape feeder 15 that joins the preceding tape and the following tape with a splicing tape. In this case, after the joining work, tape information such as a bar code label attached to supply reel 17 of the following tape is read by a reading device such as portable terminal 8 and stored in feeder storage 44. In this case, the component IDs corresponding to the preceding tape and the following tape are written in the first memory and the second memory, respectively. Furthermore, tape feeder 15 to be used may be an auto-loading tape feeder 15 that continuously inserts the preceding tape and the following tape without joining by splicing the tapes. In this case, the tape information of supply reel 17 of the following tape is read and stored in feeder storage 44. In this case, the component IDs corresponding to the preceding tape and the following tape are written in the first memory and the second memory, respectively.

There is a case where all of the components of carrier tape 18 inserted in tape feeder 15 are consumed to run out the component. Alternatively, there is a case where carrier tape 18 is not inserted due to removal of carrier tape 18 or the like. In such a case, there is a blank state where the component ID is not written in any of the first memory and the second memory. In the exemplary embodiment, the component information stored in feeder storage 44 is updated based on the detection result of tape detector 42.

That is, in a case where it is detected that carrier tape 18 is not inserted by tape detector 42 due to a command from management device 3, feeder controller 41 performs update processing for clearing the component ID written in feeder storage 44 based on an updating instruction from information updater 30c to be described later. As a result, the stored content of feeder storage 44 is normally updated to be consistent with the component state in tape feeder 15.

Here, tape feeders 150 attached to the component mounters M4 and M5 will be described. Component mounters M4 and M5 have communicator 37, mounting controller 38, and power supplier 39. Communicator 37 is a communication interface and is connected to communication network 2 to transmit information to other devices such as management device 3. In a state in which tape feeders 150 are attached to component mounters M4 and M5, tape feeders 150 are connected to component mounters M4 and M5 via input/output part 21. As a result, communicator 37 is connected to communicator 40 of tape feeder 150 via input/output part 21 and communicates with component mounters M4 and M5.

Mounting controller 38 controls the component mounting work performed by component mounters M4 and M5. Power supplier 39 has a function of supplying power to tape feeder 150 via the input/output part 21 and charging battery 25 incorporated in adapter 22 connected to input/output part 21. That is, battery 25 is normally in a charged state in a state where tape feeders 150 are attached to component mounters M4 and M5. In a case where tape feeders 15 are removed from component mounters M4 and M5, power is supplied from battery 25 to tape feeders 15.

Management device 3 has management processor 30, display 31, management storage 32, and communicator 36. Management processor 30 is provided with acquirer 30a which is an arithmetic or information processing device, and here is a functional part for performing processing for the component management in component mounting system 1, searcher 30b, information updater 30c, and instructor 30d. Display 31 is a display device such as a liquid crystal panel and displays various kinds of information referred to by operator 7 in the component management work such as search results by searcher 30b. Communicator 36 is a communication interface and is connected to communication network 2 to transmit information to other devices.

Management storage 32 is a management system side storage and stores component information 33, feeder information 34, and production plan 35. Component information 33 is information on the component used for production of the mounting board by component mounting line 4 in component mounting system 1 (refer to FIG. 5). Feeder information 34 is information on tape feeder 15 used for production of the mounting board by component mounting line 4 in component mounting system 1. Feeder information 34 includes the type of tape feeder 15, the feeder ID, the location information, and the like. Production plan 35 is a data summarizing the production information of the mounting board produced in component mounting system 1, that is, information required for production performance such as the type and quantity of the board, the type and quantity of the component to be mounted as time series data according to a production order.

Production plan 35 includes current production information and next production information. The current production information includes the component information of the component mounted in the board produced by component mounters M4 and M5 at that time. The next production information includes the component information of the component mounted on the board produced by component mounters M4 and M5 after the production based on the current production information. In this manner, the production plan including the current production information and the next production information is stored. Therefore, it is possible to extract an insufficient component which is required for the next production in the component management by management device 3 and which is not included in the existing component already disposed in each device of component mounting line 4 for the production of the board at the time.

Figure 5:
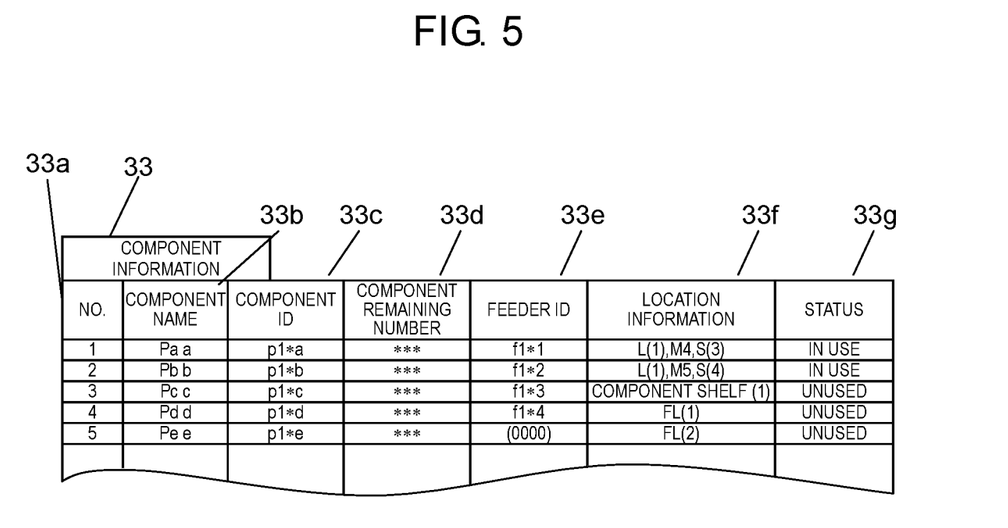
FIG. 5 is an explanatory diagram of a data configuration of component information in the component management system of the exemplary embodiment.

Here, with reference to FIG. 5, a data configuration of component information 33 stored in management storage 32 will be described. As shown in FIG. 5, component information 33 comprehensively shows information on the component present in a work section such as component mounting line 4, component storage area 5, and external set-up floor 6 in component mounting system 1. Here, in principle, the component to be managed is handled as a unit of component unit 20 (refer to FIG. 3A) which is formed as one unit by combining tape feeder 15 and supply reel 17, but included in component information 33 even in a case where supply reel 17 is present in a state removed from tape feeder 15 as an exception.

In component information 33, component name 33*b*, component ID 33*c*, component remaining number 33*d*, feeder ID 33*e*, location information 33*f*, and status 33*g* correspond to each of component unit 20 and supply reel 17 numbered by item number 33*a*.

Component name 33*b* is a name such as "Paa" for identifying the type of the component stored by carrier tape 18 wound around supply reel 17. Component ID 33*c* is an ID that identifies the type of the component by a code such as "p1*a". Component remaining number 33*d* indicates a numerical value "*" indicating the remaining number of the component stored in carrier tape 18**.

Feeder ID 33*e* is an ID that identifies tape feeder 15 constituting component unit 20 by a code such as "f1*1". Here, an item whose item number 33*a* is No. 5 indicates a state where only supply reel 17 is present alone. In this case, since tape feeder 15 is absent, (0000) indicating that a corresponding ID is absent is described in feeder ID 33*e*.

Location position information 33*f* indicates the location where component units 20 of each item shown in item number 33*a* are present. That is, an item whose item number 33*a* is No. 1 indicates that the slot number in component mounter M4 having line number L(1) of component mounting line 4 is installed on the installing slot of S(3). An item whose item number 33*a* is No. 3 indicates that the component of this item is located in component shelf 5*a*(1) of component storage area 5. An item whose item number 33*a* is No. 4 indicates that the component of this item is located in floor number FL(1) of external set-up floor 6.

Status 33*g* indicates whether the component of each item shown in the item number 33*a* is currently used or not. Here, the component whose status 33*g* is "in use" indicates that pick-up of component from component unit 20 is performed in component mounter, and the component is an item which cannot be diverted to other component. On the other hand, the component whose status 33*g* is "unused" indicates that the component is an item which is not currently used and can be diverted to other component.

Acquirer 30*a* (refer to FIG. 4) performs processing to acquire component information 45 from component mounters M4 and M5. That is, acquirer 30*a* acquires component information 45 stored in feeder storage 44 of tape feeders 15 and 150. The acquired individual component information is written as component information 33 in management storage 32, so that component information 33 described above is created. At this time, it can be determined whether component information 45 acquired by a transmission route of component information 45 is information transmitted from a separate tape feeder 15 or information transmitted from tape feeder 150 attached to component mounters M4 and M5.

That is, if the information is received via wireless station 9, it is determined that the information is transmitted from separate tape feeder 15. If the information is received from the transmission route via component mounters M4 and M5, it is determined that the information is transmitted from tape feeder 150 attached to component mounters M4 and M5. In the exemplary embodiment, wireless station 9 is disposed for each section set for identifying the location in component mounting system 1 such as component storage area 5 and external set-up floor 6, and the location of tape feeder 15 can be identified for each of the above sections by the transmission route.

Searcher 30*b* performs processing for searching the component information stored by management storage 32 (management system side storage). That is, when preparing a component required for a next production target board, operator 7 who is in charge of component mounting system 1 performs component search for confirming a location of an insufficient component extracted based on production plan 35. In the component search, the current production information and the next production information included in production plan 35 stored in management storage 32 are referred to.

Here, first, the component information included in the next production information required for the production of the next board is selected as a search target. Here, among these components information, existing component that is included in the current production information and already disposed in component mounters M4 and M5 of component mounting line 4 is excluded from the search target because there is no need to newly prepare the component. That is, searcher 30*b* first searches for the component information included in the next production information, and searches for the component information that does not match the component information included in the current production information among the component information included in the next production information. The component search is performed by causing searcher 30b of management processor 30 to perform search processing by operating portable terminal 8 by operator 7.

Next, a configuration of portable terminal 8 will be described. As shown in FIG. 4, portable terminal 8 has communicator 50, terminal storage 51, selector 54, and display 55. Communicator 50 is a communication interface having a wireless communication function, and operator 7 operates portable terminal 8, so that it is possible to transmit information to management device 3 via wireless station 9.

Component information 52 and feeder information 53 are stored in the terminal storage 51. Component information 52 and feeder information 53 store information transmitted from management device 3 to portable terminal 8 among component information 33 and feeder information 34 stored in management storage 32. Selector 54 performs processing for selecting the component to be searched by searcher 30b of management device 3. This selection is performed by either manual operation for operator 7 to determine the corresponding component from the component information displayed on portable terminal 8 or automatic selection to automatically select the component according to a selection condition preset in management processor 30 of management device 3. Display 55 is a display device such as a liquid crystal screen, and displays component information 52 and feeder information 53 stored in terminal storage 51, and component search result 56 (refer to FIG. 8A) selected by selector 54 and searched by searcher 30b.

The search described above is actually performed only for tape feeder 15 in which a presence of inserted carrier tape 18 is confirmed by a detection result by tape detector 42 in combination with supply reel 17. That is, when searcher 30b searches component information, searcher 30b searches based on the component information acquired from tape feeder 15 in which tape detector 42 has been detecting whether or not carrier tape 18 (component storage) is present since the supplying of the power from battery 25.

Information updater 30c performs processing for updating component information 45 stored in feeder storage 44 (component supply device side storage) and component information 33 stored in management storage 32 (management system side storage) based on the detection result of tape detector 42 (detector) provided in tape feeder 15. That is, although tape detector 42 in tape feeder 15 does not detect carrier tape 18, in a case where the component ID corresponding to carrier tape 18 is present in component information 45 and component information 33, information update processing to clear the feeder ID associated with the component ID and the component ID is performed. With the information update, it is possible to prevent an incorrect search that the component ID that is present only on the data of component information 33 is included in the search result even though the component is not actually present in the component search described above.

Instructor 30d instructs the operation to tape feeder 15 which is the component supply device. The operation instructed here includes a notifying operation of operating notifier 43 so as to notify the location of tape feeder 15 identified by the search result of searcher 30b by turning on display board 23. That is, instructor 30d instructs tape feeder 15 having the component information searched and identified by searcher 30b to notify notifier 43 of tape feeder 15.

Figure 6:
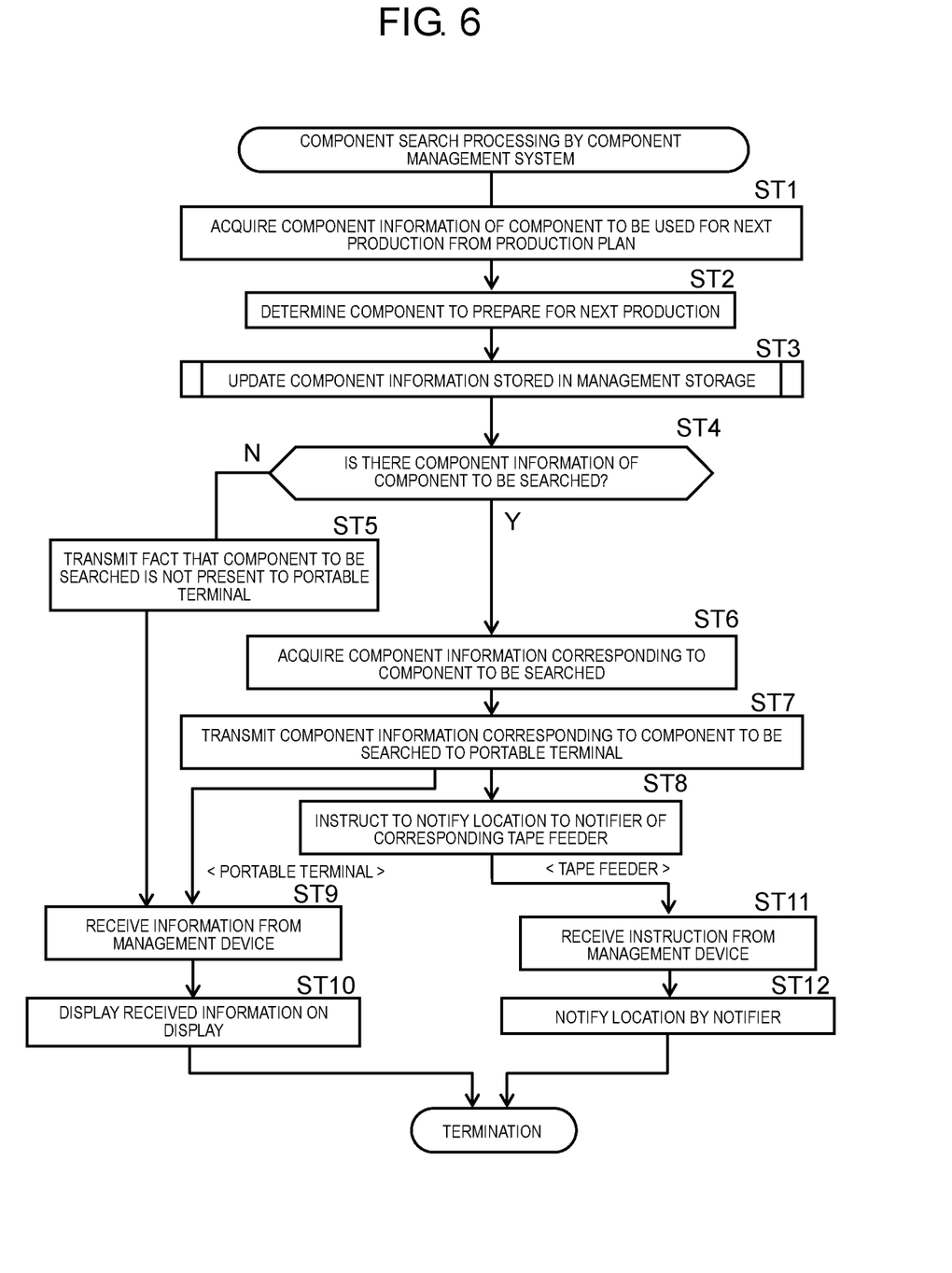
FIG. 6 is a flowchart showing component search processing according to the component management system of the exemplary embodiment.

Next, with reference to a flow of FIG. 6, the component search processing by the component management system provided in component mounting system 1 will be described. The component search processing is performed by management device 3 as the component management system. Here, in a case where the production by component mounting line 4 continues to be performed in component mounting system 1, the work processing performed in a case where the necessity to prepare the component for the next production occurred due to switching of the production type or the like is shown. The following processing may be performed by a command from the portable terminal 8.

When the processing is started, first the component information of the component to be used for the next production is acquired from the production plan (ST 1). That is, the current production information and the next production information are acquired from production plan 35 stored in management storage 32. Next, the component to prepare for the next production is determined (ST 2). As described above, the component information that does not match the component information included in the current production information is extracted and determined as the component to be prepared among the component information included in the next production information. Furthermore, it is selected as the search target by selector 54 of portable terminal 8. Search processing for confirming the location of these selected components is started.

Prior to the search processing, update processing of the component information for updating component information 33 stored in management storage 32 is performed (ST 3). The update processing of the component information will be described with reference to FIG. 7. The update processing of the component information is performed to exclude the feeder ID of tape feeder 15 in which the component is not present from component information 33 after confirming whether or not the component is actually present in tape feeder 15 for each of tape feeders 15 present on the data of component information 33 stored in management storage 32.

Figure 7:
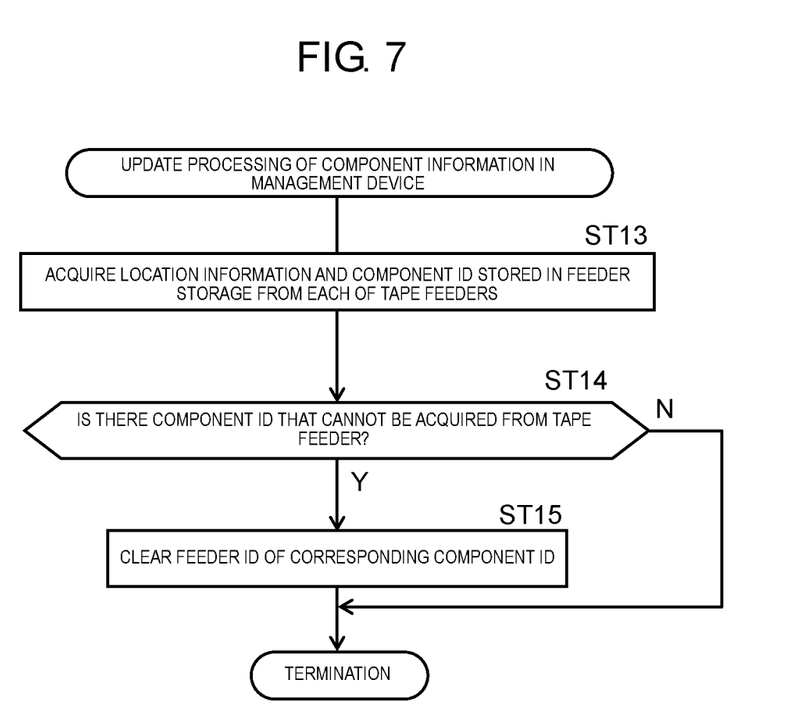
FIG. 7 is a flowchart showing component information update processing in the component management system of the exemplary embodiment.

First, the location information and the component ID stored in feeder storage 44 are acquired from each of tape feeders 15 (ST 13). Although these acquired information are stored in component information 33 of management storage 32, the presence or absence of the component ID that cannot be acquired from tape feeder 15 in ST 13 is determined (ST 14). In a case that the corresponding component ID is not present, the update processing of the component information is terminated, and in a case where the corresponding component ID is present, the update processing is performed to clear the feeder ID of the component ID (ST 15). As a result, the component ID present only on the data of component information 33 is deleted.

Using component information 33 updated in this manner as a search range, the component search targeting the component determined in ST 2 is performed. Here, it is determined whether or not there is the component information of the component to be searched in component information 33 (ST 4).

In a case that the component information of the component to be searched is not present, the fact that the component to be searched is not present is transmitted to portable terminal 8 (ST 5). On the other hand, in a case where it is found that the component information of the component to be searched is present, the component information corresponding to the component to be searched is acquired from component information 33 by acquirer 30a of management processor 30 (ST 6).

Figure 8A:
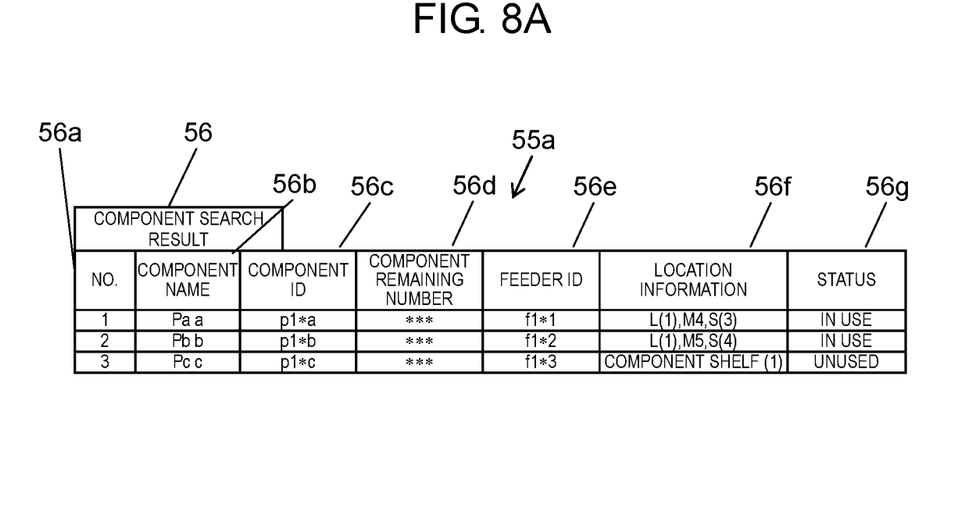
FIG. 8A is an explanatory diagram of a component search result according to the component management system of the exemplary embodiment.

Next, the acquired component information corresponding to the component to be searched is transmitted to portable terminal 8 (ST 7). Portable terminal 8 receives the information transmitted from management device 3, that is, the information transmitted in ST 5 and the information transmitted in ST 7 (ST 9), and displays the received information on display 55 (ST 10). FIG. 8A shows component search result 56 received in this manner and displayed on display screen 55*a* of display 55.

Component search result 56 in FIG. 8A is determined as the component to be prepared for the next production in ST 2, and shows the search result of the component selected as a search target. In the example shown here, in component information 33 shown in FIG. 5, an example is shown in which the search results for three types of components in which the item number 33*a* is No. 1, No. 2, and No. 3 are displayed. In component search result 56, the items indicated by item number 56*a*, component name 56*b*, component ID 56*c*, component remaining number 56*d*, feeder ID 56*e*, location information 56*f*, and status 56*g* are the same as item number 33*a*, component name 33*b*, component ID 33*c*, component remaining number 33*d*, feeder ID 33*e*, location information 33*f*, and status 33*g* in component information 33 shown in FIG. 5.

For the components of No. 1 and No. 2 (component ID (p1\*a) and (p1\*b)) among three types of components in which the item number 56*a* is No. 1, No. 2, and No. 3, line number (L (1)) of component mounting line 4 on which tape feeder 15 corresponding to the component is set by location information 56*f*, machine number (M4 and M5) of component mounter, and slot number (S (3) and S (4)) on which tape feeder 15 is installed are clearly indicated. As a result, operator 7 can identify the location of tape feeder 15 corresponding to the component to be searched.

For the component (component ID (p1\*c)) in which the item number 56*a* is No. 3, it is indicated that tape feeder 15 corresponding to the component is stored in component shelf 5*a* (1) of component storage area 5 by location information 56*f*. However, it is difficult to identify target tape feeder 15 with this display alone in a case where a plurality of tape feeders 15 are placed in same component shelf 5*a* (1).

However, in tape feeder 15 shown in the exemplary embodiment, it is possible to communicate with management device 3 by the function of communicator 24 and battery 25 incorporated in adapter 22. Therefore, even in the above case, it is possible to easily identify tape feeder 15 to be searched. That is, in the flow of FIG. 6, following ST 7, notifier 43 of tape feeder 15 is instructed to notify the location (ST 8). Tape feeder 15 receives this instruction from management device 3 (ST 11) and notifies the location by notifier 43 (ST 12).

Figure 8B:
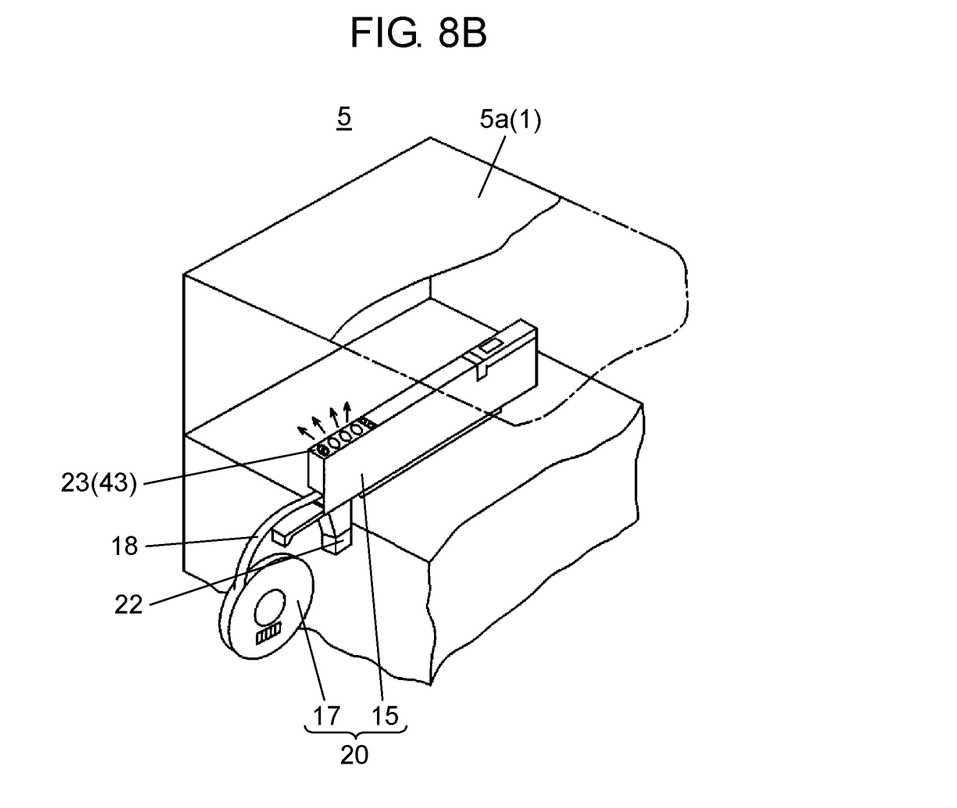
FIG. 8B is an explanatory diagram of the component supply device according to the component management system of the exemplary embodiment.

That is, by activating notifier 43 of tape feeder 15 by the function of instructor 30*d* of management processor 30 provided by management device 3, display board 23 provided on the upper surface of tape feeder 15 is tuned on as shown in FIG. 8B. As a result, operator 7 accessing component shelf 5*a* (1) can easily identify tape feeder 15 to be searched by visual inspection. By the display of ST 10 by portable terminal 8 and the notification of ST 12 in tape feeder 15, the component search processing is terminated.

Figure 9:
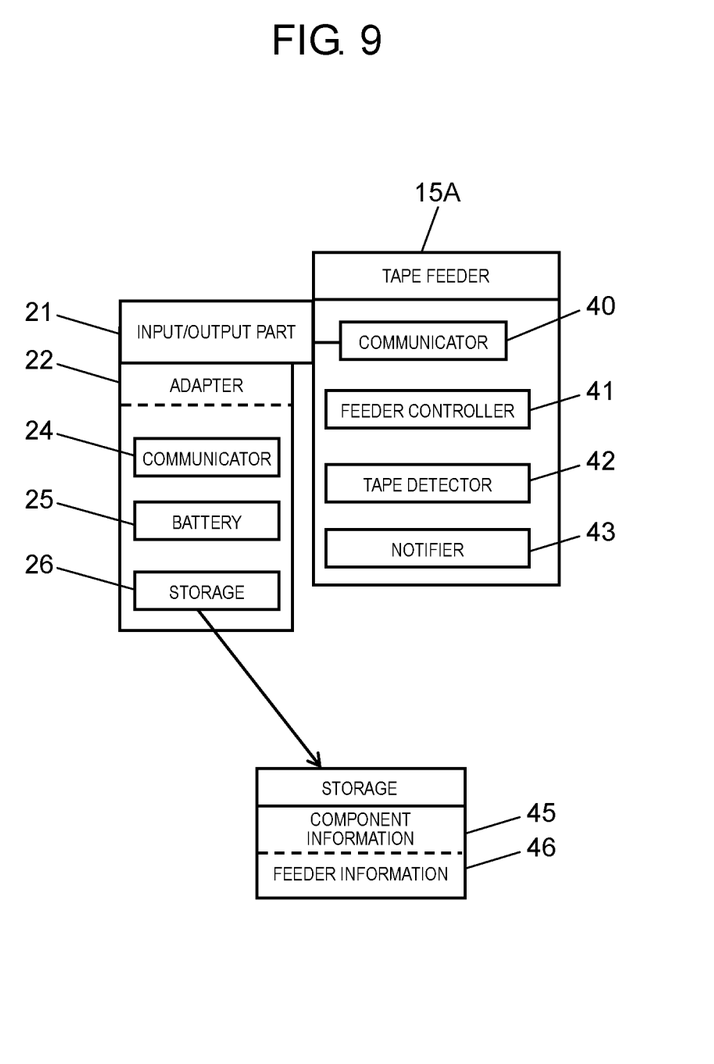
FIG. 9 is a block diagram showing a configuration of a control system of a tape feeder in the component mounting system to which the component management system of the exemplary embodiment is applied.

In tape feeder 15 shown in the exemplary embodiment, a configuration in which feeder storage 44 for storing component information 45 and feeder information 46 is incorporated in tape feeder 15 is adopted, but as shown in FIG. 9, storage unit 26 having the same function as feeder storage 44 may be incorporated in adapter 22. That is, in this configuration, adapter 22 has storage 26 for storing component information 45 of the component stored in carrier tape 18 (component storage).

In the above exemplary embodiment, an example in which the component supply device which transports the component storage storing the component to a predetermined position and supplies the component storage to the component mounter is tape feeder 15 that transports carrier tape 18 storing the component to a take-out position by the mounting head and supplies carrier tape 18 to the component mounter is shown. However, the disclosure is not limited to tape feeder 15, and the disclosure can be applied to any configuration as long as it is configured to transport the component storage storing the component to the predetermined position. For example, the disclosure is applicable to a tray feeder that uses a tray which is a flat container whose upper surface is opened as the component of the component storage, transports the tray to the component take-out position by the mounting head, and supplies the tray to the component mounter. In this case, communicator 24 shown in the exemplary embodiment, the communicator having the same function as battery 25, and the battery are attached to the tray.

As described above, the component management system shown in the exemplary embodiment relates to management device 3 as the component management system that manages the component mounted on tape feeder 15 for transporting carrier tape 18 storing the component to the predetermined position and supplying carrier tape 18 to the component mounter. Tape feeder 15 has feeder storage 44 that stores the component information of the component stored in carrier tape 18, communicator 24 that communicates with management device 3, battery 25 that supplies power in a case where power is not supplied from the component mounter to tape feeder 15, and tape detector 42 that detects the presence or absence of carrier tape 18. Management device 3 has acquirer 30*a* that acquires the component information from tape feeder 15, management storage 32 that stores the component information acquired by acquirer 30*a* in association with tape feeder 15, and information updater 30*c* that updates the component information stored in feeder storage 44 and management storage 32 based on the detection result of tape detector 42.

As a result, even in case where carrier tape 18 removed from tape feeder 15 is subject to the component management, the component information indicating the correspondence relationship between tape feeder 15 and carrier tape 18 can normally be updated to contents conforming to the actual state. Therefore, it is possible to expand the range of the component form where the component management can be normally performed, and prevent a problem such as incorrect mounting in the component mounting work.

Tape feeder 15 as the component supply device shown in the exemplary example relates to tape feeder 15 which transports carrier tape 18 storing the component to the predetermined position and supplies carrier tape 18 to the component mounter. Tape feeder 15 has input/output part 21 that transmits at least one of power supply and information input/output, and adapter 22 attached to input/output part 21. Adapter 22 is configured to have communicator 24 that communicates with management device 3 which manages the component mounter, storage unit 26 that stores the component information of the component stored in carrier tape 18, and battery 25 that supplies power to tape feeder 15 when tape feeder 15 is not set to the component mounter.

As a result, it is not required to provide a complicated configuration such as separately providing a communication means for transmitting the information of tape feeder 15 to the main body of the component mounter. The information communication between tape feeder 15 and the component mounter can be performed by a facility with a simple configuration, and the component management such as a collation of the component information and management of the component remaining number can be appropriately and efficiently performed.

According to the disclosure, it is possible to expand the scope of the component form in which the component management can be normally performed, and to prevent a problem such as the incorrect mounting in the component mounting work.

The component management system of the disclosure has the effect of extending the scope of the component form in which the component management can be normally performed and preventing a problem such as incorrect mounting in the component mounting work, and is useful in a field where the component is picked up from the component supply device such as a tape feeder to mount on the board.

What is claimed is:

1. A component management system that manages a component in a component supply device,
    wherein the component supply device transports a component storage in which the component is stored to a predetermined position and supplies the component storage to a component mounter,
    the component supply device includes:
    a component supply device side storage that stores component information of the component stored in the component storage;
    a communicator that communicates with the component management system;
    a battery that supplies power in a case where power is not supplied from the component mounter to the component supply device; and
    a detector that detects presence or absence of the component storage, and
    the component management system comprising:
    an acquirer that acquires the component information from the component supply device;
    a management system side storage that stores the component information acquired by the acquirer in association with the component supply device; and
    an information updater that updates the component information stored in the component supply device side storage and the management system side storage based on a detection result of the detector.

2. The component management system of claim 1, further comprising:
    a searcher that searches the component information stored on the management system side storage,
    wherein when searching the component information, the searcher performs the search based on the component information acquired from the component supply device in which the detector has been detecting whether or not the component storage is present since the supplying of the power from the battery.

3. The component management system of claim 1, further comprising:
    an instructor that instructs an operation to the component supply device,
    wherein the component supply device further includes a notifier that notifies a location of the component supply device, and
    the instructor instructs the notifier of the component supply device to perform the notifying, the component supply device having the component information searched out and identified by a searcher.

4. The component management system of claim 1,
    wherein the management system side storage stores current production information including the component information of the component to be mounted on a board produced by the component mounter, and next production information including the component information of the component to be mounted on the board produced by the component mounter after production based on the current production information, and
    a searcher searches for the component information included in the next production information.

5. The component management system of claim 4,
    wherein the searcher searches for the component information that does not match the component information included in the current production information among the component information included in the next production information.

6. The component management system of claim 1,
    wherein the component supply device is a tape feeder and the component storage is a carrier tape that stores the component.

7. A component supply device that transports a component storage in which a component is stored to a predetermined position and supplies the component storage to a component mounter, the device comprising:
    an input/output part that transmits at least one of power supply and information input/output; and
    an adapter including:
    a communicator that communicates with a management system managing the component mounter;
    a storage that stores component information of the component stored in the component storage; and
    a battery that supplies power to the component supply device when the component supply device is not set to the component mounter,
    wherein the adapter can be physically attached to the input/output part.

8. The component supply device of claim 7,
    wherein the component supply device is a tape feeder which transports a carrier tape serving as the component storage to the predetermined position by pitch feed, and
    the input/output part is disposed on an opposite side of a side of the tape feeder to be installed on the component mounter.

9. A method of managing a component in a component supply device, the method comprising:
    storing component information in a component supply device, the component supply device having a battery that supplies power in a case where power is not supplied from a component mounter to the component supply device;
    detecting a presence or absence of a component storage by the component supply device;
    acquiring component information from the component supply device by a component management system;
    storing the acquired component information in association with the component supply device; and
    updating component information stored in the component supply device and in the management system based on whether the presence of absence of the component storage was detected by the component supply device.

* * * * *